United States Patent
Higo et al.

(10) Patent No.: US 8,557,891 B2
(45) Date of Patent: Oct. 15, 2013

(54) PHOTOCURABLE RESIN COMPOSITION AND OPTICAL COMPONENT USING THE SAME

(75) Inventors: Yukiko Higo, Osaka (JP); Hiroshi Noro, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/179,625

(22) Filed: Jul. 11, 2011

(65) Prior Publication Data
US 2012/0010319 A1   Jan. 12, 2012

(30) Foreign Application Priority Data
Jul. 12, 2010 (JP) .................................. 2010-158038

(51) Int. Cl.
C08F 2/42 (2006.01)
C08J 3/28 (2006.01)
B32B 27/38 (2006.01)

(52) U.S. Cl.
USPC ........... 522/168; 522/170; 525/523; 525/524; 428/411.1; 428/413

(58) Field of Classification Search
USPC .................... 522/170, 168; 525/523, 524, 50; 428/411.1, 413
See application file for complete search history.

(56) References Cited

U.S. PATENT DOCUMENTS

| | | | |
|---|---|---|---|
| 8,293,448 B2 * | 10/2012 | Ito et al. ................... | 430/269 |
| 8,427,583 B2 * | 4/2013 | Segall ....................... | 348/607 |
| 2008/0085985 A1 * | 4/2008 | Nakamura et al. .......... | 528/25 |
| 2009/0209674 A1 * | 8/2009 | Ito et al. .................... | 522/15 |
| 2009/0279188 A1 | 11/2009 | Do | |
| 2009/0295003 A1 | 12/2009 | Noro et al. | |
| 2010/0174098 A1 | 7/2010 | Hirotsu et al. | |
| 2010/0324164 A1 | 12/2010 | Higo et al. | |

FOREIGN PATENT DOCUMENTS

| | | |
|---|---|---|
| JP | 2004-051556 A | 2/2004 |
| JP | 3926380 B1 | 3/2007 |
| JP | 2007-084613 A | 4/2007 |
| JP | 2007-332294 A | 12/2007 |
| JP | 2009173781 A | 8/2009 |
| JP | 2009-227936 A | 10/2009 |
| JP | 2009-286928 A | 12/2009 |
| JP | 2011-021177 A | 2/2011 |
| JP | 2011-213791 A | 10/2011 |
| JP | 2011213791 A * | 10/2011 |
| WO | 2007/142236 A1 | 12/2007 |
| WO | 2007145309 A1 | 12/2007 |

OTHER PUBLICATIONS

Notification of Reasons for Refusal dated May 10, 2013 issued by the Japanese Patent Office in corresponding application No. 2010158038.

* cited by examiner

*Primary Examiner* — Sanza McClendon
(74) *Attorney, Agent, or Firm* — Sughrue Mion, PLLC

(57) ABSTRACT

The present invention relates to a photocurable resin composition including an epoxy resin, an oxetane compound and a photopolymerization initiator, in which the epoxy resin includes the following ingredients (A) and (B) in combination, and the oxetane compound includes the following ingredient (C): (A) an epoxy resin having at least two epoxy groups in one molecule thereof and being liquid at 60° C. or higher; (B) a solid epoxy resin having at least two epoxy groups in one molecule thereof and having a refractive index of 1.6 or more by itself; and (C) an oxetane compound represented by the following general formula (1) in which n is an integer of 1 to 6.

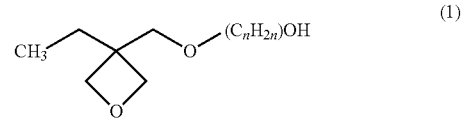

(1)

5 Claims, No Drawings

PHOTOCURABLE RESIN COMPOSITION AND OPTICAL COMPONENT USING THE SAME

FIELD OF THE INVENTION

The present invention relates to a photocurable resin composition having low water-absorbability and excellent curability as a transparent resin for the purpose of optical applications, and relates to an optical component using the composition. Specifically, the invention relates to a photocurable resin composition suitable as a molding material for optical components such as optical lenses (material for optical components) and the like, and relates to an optical component using the composition.

BACKGROUND OF THE INVENTION

In imaging devices for use in mobile phones and digital cameras, optical lenses for imaging are mounted. As materials for forming the optical lenses, optical glasses and transparent plastic materials have been generally used. In particular, with recent increase in the diffusion of the mobile phones fitted with an imaging function, it has been needed to produce the lenses more inexpensively and hence the transparent plastic materials having optical transparency have been required. Furthermore, with the recent trend of high resolution and thinning in the optical lenses for imaging, the materials having a higher refractive index (refractive index of 1.55 or more) have been needed.

As a method for producing optical components such as optical lenses using the transparent plastic materials, for example, there is mentioned a method including pressing a predetermined shaping mold against the transparent plastic material (resin composition) to fill the transparent plastic material into the mold, followed by releasing the material from the mold. That is, by transfer molding with the mold, an optical component having a specific micropattern or an odd shape can be obtained (for example, see Patent Document 1).

Depending on physical properties of the transparent plastic materials, from the viewpoint of dimensional stability, the following two types of curing methods are employed. Specifically, there are mentioned (1) a method including hot-melting a thermoplastic resin that is a transparent plastic material, then pressing a shaping mold against it, and cooling it to obtain a molded article (optical component) having a specific shape; and (2) a method including pressing the shaping mold against a photocurable resin composition as the transparent plastic material, and then irradiating it with light through the shaping mold or a substrate to obtain a molded article (optical component) having a specific shape.

In general, these two types of methods are selected depending on the required heat resistance temperature; and for example, in the field not requiring heat resistance, the method (1) of using a highly transparent thermoplastic resin such as polymethyl methacrylate (PMMA) or polycarbonate is widely employed. However, recently, for the purpose of more inexpensive and large-scale production, it is strongly desired to mount the imaging device itself on a printed board by reflow soldering. In that case, since the device is exposed to a high-temperature environment of softening temperature or higher at the mounting step, a problem of generation of softening and dimensional deformation remains in the use of the aforementioned thermoplastic resin.

From such a background, in the field of requiring heat resistance for reflow soldering or autoclaving etc., application of a photocurable resin including an epoxy resin as the main ingredient has been investigated and is being put into practical use. However, in the shaping method of optical components using the photocurable resin composition, at the release from the mold after curing by photoirradiation, there is a possibility that cohesive failure from the resin inside may take place owing to insufficient curing of the resin, whereby a defect may be generated in the molded article. Therefore, it is required to obtain a molded article having no defect with suppressing cohesive failure by improving the curability of the resin. Moreover, from the viewpoint of productivity, it is also required to be a material capable of attaining curing for a short period of time.

As a method for improving the curability of the photocurable resin composition, addition of an oxetane compound is generally known. In particular, an oxetane material having a primary alcohol (for example, 3-ethyl-3-hydroxymethyloxetane or the like) is known to exhibit a high effect of rapid curability because the hydroxyl group plays a role as a chain transfer agent in the photocuring reaction (for example, see Patent Document 2).

Patent Document 1: Japanese Patent No. 3926380
Patent Document 2: JP-A-2009-227936

SUMMARY OF THE INVENTION

However, when the oxetane compound having a primary alcohol as mentioned above is blended into the photocurable resin composition, there occurs a problem that water absorbability of the photocurable resin composition increases owing to high hydrophilicity of the hydroxyl group along with the effect of improving the curability derived from the oxetane ring and the hydroxyl group. Thus, when the water absorbability increases, for example, there is an increased possibility of such an inferior reliability that uneven curing at photocuring may take place and a desired refractive index may not be obtained. Accordingly, defective quality in optical components is prone to be generated. Therefore, in the photocurable resin composition for use in the above-mentioned use application, the water absorbability is desired to be as low as possible. Such a photocurable resin composition capable of attaining both rapid curability and low water absorbability along with a high refractive index has not yet been obtained, and there still remains a matter for studies thereon.

The present invention has been made in consideration of the situation as above, and an object thereof is to provide a photocurable resin composition capable of attaining a high refractive index and also both rapid curability and low water absorbability and useful as a material for optical components such as optical lenses, and to provide an optical component using the composition.

Namely, the present invention relates to the following items 1 to 5.

1. A photocurable resin composition including an epoxy resin, an oxetane compound and a photopolymerization initiator, in which the epoxy resin includes the following ingredients (A) and (B) in combination, and the oxetane compound includes the following ingredient (C):

(A) an epoxy resin having at least two epoxy groups in one molecule thereof and being liquid at 60° C. or higher;

(B) a solid epoxy resin having at least two epoxy groups in one molecule thereof and having a refractive index of 1.6 or more by itself; and (C) an oxetane compound represented by the following general formula (1):

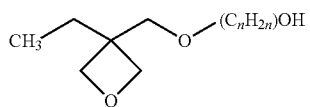

in which n is an integer of 1 to 6.

2. The photocurable resin composition according to item 1, in which the ingredient (C) is contained in an amount of from 5 to 15% by weight relative to 100% by weight of a total resin amount in the resin composition.

3. The photocurable resin composition according to item 1 or 2, in which the ingredient (B) is a fluorene epoxy resin.

4. The photocurable resin composition according to any one of items 1 to 3, in which the ingredient (A) is contained in an amount of from 40 to 85% by weight and the ingredient (B) is contained in an amount of from 10 to 45% by weight relative to 100% by weight of the total resin amount in the resin composition.

5. An optical component formed from a cured product of the photocurable resin composition according to any one of items 1 to 4 and having a refractive index of 1.55 or more.

Specifically, the present inventors have assiduously studied for the purpose of solving the above-mentioned problems. In the process of the studies, they have devised to use a specific oxetane compound (ingredient (C)) represented by the above general formula (1) in the photocurable resin composition including an epoxy resin, an oxetane compound, and a photopolymerization initiator. Since the oxetane compound has a C1 to C6 alkyl chain, hydrophobicity can be improved with exhibiting curability equal to or higher than that in the case of a primary alcohol-containing oxetane compound having no alkylene chain. Therefore, it becomes possible to attain both rapid curability and low water absorbability. Moreover, when the epoxy resin of the ingredient (A) and the epoxy resin of the ingredient (B) are used in combination as the epoxy resin, effects of improving flowability, heat resistance and mechanical properties are obtained and also it becomes possible to control the refractive index after curing to a high refractive index (refractive index of 1.55 or more). Thus, the inventors have come to the conviction that the intended object can be attained by these findings, and have achieved the invention.

As in the above, the photocurable resin composition of the invention includes an epoxy resin (ingredient (A)) having at least two epoxy groups in one molecule thereof and being liquid at 60° C. or higher and a solid epoxy resin (ingredient (B)) having at least two epoxy groups in one molecule thereof and having a refractive index of 1.6 or more by itself in combination and a specific oxetane compound (ingredient (C)). Therefore, a high refractive index can be attained and also both rapid curability and low water absorbability can be achieved. Moreover, effects of improving flowability, heat resistance and mechanical properties are also obtained. Furthermore, the photocurable resin composition of the invention can be not only cured solely by itself but also cured on another member, for example, a transparent substrate such as glass. By integrating the composition with the transparent substrate, it is possible to produce a high-quality hybrid lens. Accordingly, when the photocurable resin composition of the invention is used as a molding material for optical materials such as optical lenses, it can be used as a highly reliable photocurable resin exhibiting high productivity, so that the composition is useful. Moreover, since the photocurable resin composition of the invention is usually a liquid composition before curing, it is also possible to use the composition as a photocurable adhesive for fixation of optical components.

Furthermore, the optical component of the invention, which uses the above-mentioned photocurable resin composition, is inexpensive and also has a high refractive index (refractive index of 1.55 or more), so that the optical component can be advantageously used as an optical lens or the like for imaging devices for used in mobile phones, digital cameras, and the like.

DETAILED DESCRIPTION OF THE INVENTION

Embodiments of the invention are described below.

The photocurable resin composition (photocurable resin composition for optical components) of the invention is a photocurable resin composition including an epoxy resin, an oxetane compound and a photopolymerization initiator, in which the epoxy resin includes the following ingredients (A) and (B) in combination, and the oxetane compound includes the following ingredient (C):

(A) an epoxy resin having at least two epoxy groups in one molecule thereof and being liquid at 60° C. or higher;

(B) a solid epoxy resin having at least two epoxy groups in one molecule thereof and having a refractive index of 1.6 or more by itself; and (C) an oxetane compound represented by the following general formula (1):

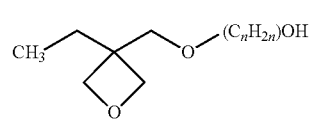

in which n is an integer of 1 to 6. Additionally, the photocurable resin composition is usually a liquid composition.

The epoxy resin of the ingredient (A) is sufficiently an epoxy resin having at least two epoxy groups in one molecule thereof and being liquid at 60° C. or higher, as mentioned in the above. Examples of the epoxy resin include bisphenol A type epoxy resins, bisphenol F type epoxy resins, bisphenol S type epoxy resins, linear aliphatic epoxy resins, hydrogenated bisphenol A type epoxy resins, hydrogenated bisphenol F type epoxy resins and alicyclic epoxy resins. These epoxy resins may be used alone or in combination thereof. Above all, in view of reactivity, transparency, viscosity, and the like, bisphenol A type epoxy resins and bisphenol F type epoxy resins are preferred.

The epoxy resin of the ingredient (B) is sufficiently a solid epoxy resin [solid at room temperature (25° C.)] having at least two epoxy groups in one molecule thereof and having a refractive index of 1.6 or more by itself, as mentioned in the above. Examples of the epoxy resin include epoxy resins having a fluorene skeleton (fluorene epoxy resins), epoxy resins having an anthracene skeleton, epoxy resins having a carbazole skeleton, epoxy resins having a biphenyl skeleton, epoxy resins having a naphthalene skeleton, and the like. These epoxy resins may be used alone or in combination thereof. Above all, from the viewpoint of transparency and the like, the fluorene epoxy resins are preferred. Incidentally, the measurement of the refractive index is performed by measuring the refractive index using a refractometer (manufactured by Atago Co., Ltd.) after the surface of cured product of the epoxy resin is ground by a grinder. Incidentally, as an epoxy resin, the other epoxy resin may be used in addition to the ingredients (A) and (B) according to the necessity.

By including the epoxy resins of the ingredients (A) and (B) in combination, the effect of improving flowability and heat resistance owing to the ingredient (A) is obtained and also the effect of improving mechanical properties owing to the ingredient (B) is obtained.

In the resin composition for optical components of the invention, preferably, the ingredient (A) is contained in an amount of from 40 to 85% by weight and the ingredient (B) is contained in an amount of from 10 to 45% by weight relative to 100% by weight of the total resin amount [total weight of the epoxy resins [including (A) and (B) as essential ingredients and the other epoxy resin as an optional ingredient] and the oxetane compound [including (C) as an essential ingredient and the other oxetane compound as an optional ingredient]] and more preferably, the ingredient (A) is contained in an amount of from 40 to 80% by weight and the ingredient (B) is contained in an amount of from 15 to 45% by weight relative to 100% by weight of the total resin amount. Namely, when the ingredient (A) is more than the above range, the mechanical properties and the curability may worsen; but on the contrary, when the ingredient is less than the above range, the handling property under room temperature may worsen as the viscosity increases. Moreover, when the ingredient (B) is more than the above range, the viscosity increases and thus the handling property under room temperature may worsen; but on the contrary, when the ingredient is less than the above range, the heat resistance may worsen.

As the oxetane compound (ingredient (C)) that is used along with the epoxy resins of the ingredients (A) and (B), as mentioned in the above, the oxetane compound represented by the following general formula (1) is used.

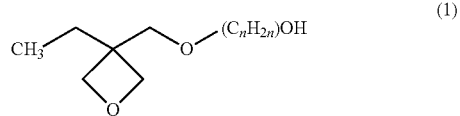

(1)

in which n is an integer of 1 to 6.

Since the oxetane compound (C) represented by the above general formula (1) has a C1 to C6 alkyl chain originated from the fact that n is from 1 to 6 in the formula, as compared with primary alcohol-lcontaining oxetane compounds having no alkyl chain, the hydrophobicity can be enhanced with exhibiting the curability equal to or higher than the curability of the primary alcohol-containing oxetane compounds. In particular, in the resin composition for optical components of the invention, from the viewpoint of flowability, it is preferred to use the oxetane compound of the above general formula (1) wherein n is from 1 to 4.

The oxetane compound (C) represented by the above general formula (1) is preferably contained in an amount of from 5 to 15% by weight relative to 100% by weight of the total resin amount [total weight of the epoxy resins [including (A) and (B) as essential ingredients and the other epoxy resin as an optional ingredient] and the oxetane compound [including (C) as an essential ingredient and the other oxetane compound as an optional ingredient]]. Namely, when the content thereof is less than the above range, the effect of improving the curability owing to the ingredient (C) may not be obtained; but on the contrary, when the content exceeds the above range, the heat resistance of the cured product may worsen.

In this regard, along with the oxetane compound of the ingredient (C), an oxetane compound different from the ingredient (C) may be used in combination according to the necessity. Examples of the oxetane compound include 3-ethyl-3-{[(3-ethyloxetan-3-yl)methoxy]methyl}oxetane, 1,4-bis[(3-ethyl-3-oxetanylmethoxy)methyl]benzene, di[2-(3-oxetanyl)butyl]ether, 3-ethyl-3-phenoxymethyloxetane, 3-ethyl-3-hydroxymethyloxetane, 1,4-bis[(3-ethyloxetan-3-yl)methoxy]benzene, 1,3-bis[(3-ethyloxetan-3-yl)methoxy]benzene, 1,2-bis[(3-ethyloxetan-3-yl)methoxy]benzene, 4,4'-bis[(3-ethyloxetan-3-yl)methoxy]biphenyl, 2,2'-bis[(3-ethyl-3-oxetanyl)methoxy]biphenyl, 3,3',5,5'-tetramethyl-[4,4'-bis(3-ethyloxetan-3-yl)methoxy]biphenyl, 2,7-bis[(3-ethyloxetan-3-yl)methoxy]naphthalene, 1,6-bis[(3-ethyloxetan-3-yl)methoxy]-2,2,3,3,4,4,5,5-octafluorohexane, 3(4),8(9)-bis[(1-ethyl-3-oxetanyl)methoxymethyl]-tricyclo [5.2.1.2.6]decane, 1,2-bis{[2-(1-ethyl-3-oxetanyl)methoxy]ethylthio}ethane, 4,4'-bis [(1-ethyl-3-oxetanyl)methyl]thiodibenzene thioether, 2,3-bis[(3-ethyloxetan-3-yl)methoxymethyl]-norbornane, 2-ethyl-2-[(3-ethyloxetan-3-yl)methoxymethyl]-1,3-O-bis[(1-ethyl-3-oxetanyl)methyl]-propane-1,3-diol, 2,2-dimethyl-1,3-O-bis [(3-ethyloxetan-3-yl)methyl]-propane-1,3-diol, 2-butyl-2-ethyl-1,3-O-bis[(3-ethyloxetan-3-yl)methyl]-propane-1,3-diol, 1,4-O-bis[(3-ethyloxetan-3-yl)methyl]-butane-1,4-diol, and 2,4,6-O-tris[(3-ethyloxetan-3-yl)methyl]cyanurate. Along with the oxetane compound of the ingredient (C), these oxetane compounds may be used alone or in combination thereof.

The content of the oxetane compound different from the ingredient (C) can be appropriately set based on the contents of the ingredients (A) to (C) mentioned in the above.

In the resin composition for optical components of the invention, the photopolymerization initiator to be used along with the above-mentioned resin ingredients (A) to (C) may be any one as far as it can initiate cation polymerization. For example, there may be mentioned onium salts composed of an anion component derived from antimony, phosphorus, or the like and a cation component derived from sulfonium, iodonium, phosphonium, or the like. Specifically, aromatic sulfonium salts, aromatic iodonium salts, aromatic phosphonium salts, and aromatic sulfoxonium salts may be mentioned. These onium salts may be used alone or in combination thereof. Above all, from the viewpoint of the photocurability, aromatic sulfonium salts are preferred.

The content of the photopolymerization initiator is preferably set within a range of from 0.05 to 5 parts by weight relative to 100 parts by weight of the total resin amount [total weight of the epoxy resins [including (A) and (B) as essential ingredients and the other epoxy resin as an optional ingredient] and the oxetane compound [including (C) as an essential ingredient and the other oxetane compound as an optional ingredient]], and is more preferably within a range of from 0.1 to 4 parts by weight. Specifically, when the content of the photopolymerization initiator is less than the above range, the curability may tend to worsen; but on the contrary, when it exceeds the above range, there may be a possibility that the transparency of the cured product may impaired though the curability could increase. Incidentally, the photopolymerization initiator may be diluted with an organic solvent such as propylene carbonate and then blended.

Moreover, into the photocurable resin composition of the invention, from the viewpoint of flowability and the like, a monofunctional epoxy resin or the like can be blended as the above-mentioned other epoxy resin. Furthermore, for the purpose of enhancing the curability, a photo sensitizer such as anthracene, an acid amplifier, or the like can be blended according to the necessity. Additionally, in the use application of preparing a cured product on a substrate such as glass, for the purpose of enhancing the adhesiveness to the substrate, a silane-based or titanium-based coupling agent may be added.

Further, as other ingredients, a flexibility enhancing agent such as a synthetic rubber or a silicone compound, an antioxidant, a defoaming agent, various pigments and dyes, an inorganic filler, etc can be appropriately blended according to the necessity.

The photocurable resin composition of the invention may be produced, for example, by blending the epoxy resin of the ingredient (A), the epoxy resin of the ingredient (B), the oxetane compound of the ingredient (C), the photopolymerization initiator, and optionally other additives, in a predetermined ratio and mixing them.

The photocurable resin composition of the invention may be used, for example, as follows. Briefly, the resin composition is potted on a transparent substrate such as glass, then a desired shaping mold is pressed against it so that the mold is filled with the resin composition, and this is irradiated with light. Thereafter, a cured product (shaped product) of the resin composition integrated on the transparent substrate can be obtained by removing the shaping mold. After the photoirradiation, in order to enhance the adhesiveness of the cured product to the transparent substrate, a heat treatment may be performed at a predetermined temperature according to the necessity.

For the photoirradiation, for example, a UV lamp or the like may be used as the device; and the irradiation energy is preferably from 2,000 to 200,000 mJ/cm$^2$. Namely, when the irradiation energy is less than the above range, the curing may be insufficient and a desired shape of the curing product could not be formed on the substrate; but on the contrary, when it exceeds the above range, over-irradiation may cause photo-degradation of the cured product and the product may be discolored in the subsequent heat treatment or the like. Regarding the condition for the heat treatment after the photoirradiation, preferably, the cured product is heated at 80 to 170° C. for about 1 hour.

Not limited to the above-mentioned molding with a shaping mold, the photocurable resin composition of the invention may be a sheet-like shaped. The resulting sheet may be irradiated with light, using a UV lamp or the like as in the above, and may be thereby cured. As the light source for the photoirradiation, for example, usable are a low-pressure mercury lamp, a high-pressure mercury lamp, an ultra-high-pressure mercury lamp, a xenon lamp, etc.

The photocurable resin composition of the invention can be used as a molding material for optical components such as optical lenses (material for optical components), and also as a photocurable adhesive for fixation of optical components, etc.

The optical component (cured resin product) of the invention such as typically the optical lenses has preferably a refractive index of 1.55 or more, and more preferably, the refractive index is a range of from 1.55 to 1.62. The above-mentioned refractive index can be realized by using the photocurable resin composition of the invention. Incidentally, the measurement of the refractive index is performed by measuring the refractive index using a refractometer (manufactured by Atago Co., Ltd.) after the surface of cured product of the epoxy resin is ground by a grinder.

EXAMPLES

The invention is described with reference to the following Examples and Comparative Examples. However, the invention should not be restricted by these Examples.

Prior to Examples and Comparative Examples, the following materials were prepared.

Epoxy resin (a) (ingredient (A)):
an alicyclic epoxy resin being liquid at room temperature (25° C.) (Celloxide 2021P manufactured by Daicel Chemical Industries, Ltd.)
Epoxy resin (b) (ingredient (A)):
a bisphenol A type liquid epoxy resin (epoxy value: 185 g/eq., viscosity measured at 25° C.: 10,000 mPa·s)
Epoxy resin (c) (ingredient (A)):
a bisphenol A type solid epoxy resin (epoxy value: 172 g/eq., viscosity measured at 25° C.: 4,400 mPa·s, melting temperature: 45° C.)
Epoxy resin (d) (ingredient (A)):
a bisphenol F type liquid epoxy resin (epoxy value: 163 g/eq., viscosity measured at 25° C.: 2,170 mPa·s)
Epoxy resin (e) (ingredient (B)):
a fluorene epoxy resin (Oncoat EX1040 manufactured by Nagase & Co., Ltd., refractive index: about 1.63, solid at room temperature (25° C.), melt-stating temperature: 70° C.)
Oxetane compound (a) (ingredient (C)):
an oxetane compound of the formula (1) in which n is 4
Oxetane compound (b):
3-methyl-3-hydroxymethyloxetane
Oxetane compound (c):
3-ethyl-3-phenoxymethyloxetane
Oxetane compound (d):
4,4'-bis[(3-ethyl-3-oxetanyl)methoxymethyl]biphenyl
Photopolymerization initiator (a):
a triarylsulfonium salt-based photopolymerization initiator composed of an anion component and a cation component, represented by the following structural formula (2):

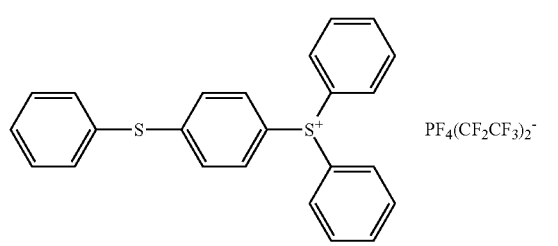

(2)

Photopolymerization initiator (b):
a triarylsulfonium salt-based photopolymerization initiator composed of an anion component and a cation component, represented by the following structural formula (3):

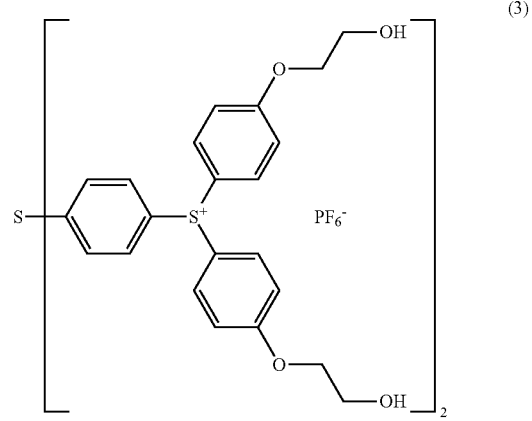

(3)

Photopolymerization initiator (c):
a triarylsulfonium salt-based photopolymerization initiator composed of an anion component and a cation component, represented by the following structural formula (4):

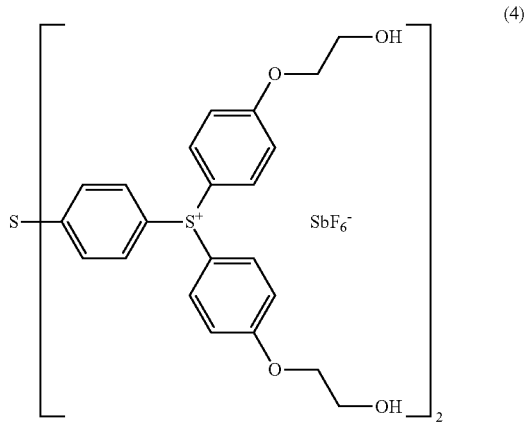

(4)

Examples 1 to 10, Comparative Examples 1 to 10

The above-mentioned individual ingredients were blended in the ratio indicated in the following Tables 1 to 4, and hot-meted and mixed to prepare photocurable resin compositions of Examples and Comparative Examples. Incidentally, Comparative Example 1 is provided for the purpose of comparison with Example 1. As shown in the following Tables 1 and 3, the blend composition of the individual ingredients in Comparative Example 1 is the same as in Example 1 except that the type of the oxetane compound is different from each other. As shown in the following Tables 1 to 4, other Comparative Examples are also provided for the purpose of comparison with Examples having the same number as the number of Comparative Examples.

The photocurable resin compositions of Examples and Comparative Examples thus produced were tested and evaluated for the properties thereof according to the standards mentioned below. The results thereof are shown in the following Tables 1 to 4. Incidentally, as mentioned in the above, since Comparative Examples are provided for the purpose of comparison with Examples having the same number as the number of Comparative Examples, the evaluation of each property is not compared between Examples or Comparative Examples.

Refractive Index

After the photocurable resin composition (liquid resin) was poured into a transparent mold having a size of 1 cm×1.5 cm×0.5 cm and was cured by irradiation with UV at 16,000 mJ, the resin was removed from the mold and was subjected to heat treatment at 150° C. for 1 hour. The surface of the molded product (cured product) thus obtained was ground by a grinder and the refractive index of the molded product (cured product) at 25° C. was measured using a refractometer (manufactured by Atago Co., Ltd.).

Curability (Gel Time)

Using a UV rheometer (manufactured by Rheologica, having 15 mmφ aluminum parallel plates) with a mercury lamp (LC-8 manufactured by Hamamatsu Photonics, this was so set that its illuminance at 365 nm could be 30 mW/cm$^2$) as the light source, the gel time of the sample was determined to evaluate the curability thereof. The viscoelasticity of the photocurable resin composition was measured at 25° C., using the UV rheometer, and the arrival time to $10^5$ Pa for the elastic term (G') was taken as the gel time determined with the UV rheometer.

Water Content

The photocurable resin composition (liquid resin) was weighed into an aluminum petri dish in an amount of 5 g and the whole was placed in a constant-temperature and constant-humidity chamber at 25° C. and 60% and allowed to stand for 30 minutes. Then, water content (containing ratio) in the resin composition before it was placed in the constant-temperature and constant-humidity chamber (before placing in the chamber) and after it was allowed to stand in the chamber (after standing in the chamber) was measured by a Karl Fischer's volume titration type automatic water content measuring apparatus (KF-07 model, manufactured by Mitsubishi Chemical Corporation). Also, a water content increase ratio (water absorbability) induced by the standing in the constant-temperature and constant-humidity chamber was calculated from the measured value.

TABLE 1

| | | (parts by weight) | | | | |
| --- | --- | --- | --- | --- | --- | --- |
| | | Example | | | | |
| | | 1 | 2 | 3 | 4 | 5 |
| Epoxy resin | a | 32 | 25 | 32 | 20 | — |
| | b | — | — | — | 40 | — |
| | c | 32 | — | 15 | — | — |
| | d | — | 45 | — | — | 40 |
| | e | 29 | 20 | 43 | 15 | 35 |
| Oxetane compound | a | 7 | 10 | 10 | 5 | 5 |
| | b | — | — | — | — | — |
| | c | — | — | — | 20 | — |
| | d | — | — | — | — | 20 |
| Photopolymerization Initiator*) | a | 0.1 | 0.15 | 0.1 | 0.15 | 0.1 |
| | b | — | — | — | — | — |
| | c | — | — | — | — | — |
| Refractive index | | 1.57 | 1.57 | 1.57 | 1.56 | 1.60 |
| Curability | Gel time (sec) | 450 | 216 | 101 | 449 | 211 |

TABLE 1-continued (parts by weight)

|  |  | Example | | | | |
|---|---|---|---|---|---|---|
|  |  | 1 | 2 | 3 | 4 | 5 |
| Water content | Before placing in chamber (%) | 0.1884 | 0.1387 | 0.1981 | 0.1776 | 0.1477 |
|  | After standing in camber (%) | 0.2718 | 0.2256 | 0.3002 | 0.2542 | 0.2321 |
|  | Water absorbability (%) | 44.3 | 62.7 | 51.5 | 43.1 | 57.1 |

*)The amount of the photopolymerization initiator is a blend amount as a 50% by weight propylene carbonate solution.

TABLE 2

(parts by weight)

|  |  | Example | | | | |
|---|---|---|---|---|---|---|
|  |  | 6 | 7 | 8 | 9 | 10 |
| Epoxy resin | a | — | 38 | — | 25 | 10 |
|  | b | — | — | — | — | — |
|  | c | 50 | 32 | 50 | 15 | 50 |
|  | d | — | — | — | 45 | — |
|  | e | 40 | 25 | 40 | 10 | 25 |
| Oxetane compound | a | 10 | 5 | 10 | 5 | 15 |
|  | b | — | — | — | — | — |
|  | c | — | — | — | — | — |
|  | d | — | — | — | — | — |
| Photopolymerization Initiator*) | a | 0.15 | — | — | 0.2 | 0.15 |
|  | b | — | 2 | — | — | — |
|  | c | — | — | 0.1 | — | — |
| Refractive index |  | 1.60 | 1.57 | 1.60 | 1.57 | 1.58 |
| Curability | Gel time (sec) | 432 | 94 | 453 | 521 | 230 |
| Water content | Before placing in chamber (%) | 0.1374 | 0.1562 | 0.1359 | 0.1648 | 0.1562 |
|  | After standing in camber (%) | 0.2253 | 0.2449 | 0.221 | 0.2652 | 0.2431 |
|  | Water absorbability (%) | 64.0 | 56.8 | 62.6 | 60.9 | 55.6 |

*)The amount of the photopolymerization initiator is a blend amount as a 50% by weight propylene carbonate solution.

TABLE 3

(parts by weight)

|  |  | Comparative Example | | | | |
|---|---|---|---|---|---|---|
|  |  | 1 | 2 | 3 | 4 | 5 |
| Epoxy resin | a | 32 | 25 | 32 | 20 | — |
|  | b | — | — | — | 40 | — |
|  | c | 32 | — | 15 | — | — |
|  | d | — | 45 | — | — | 40 |
|  | e | 29 | 20 | 43 | 15 | 35 |
| Oxetane compound | a | — | — | — | — | — |
|  | b | 7 | 10 | 10 | 5 | 5 |
|  | c | — | — | — | 20 | — |
|  | d | — | — | — | — | 20 |
| Photopolymerization Initiator*) | a | 0.1 | 0.15 | 0.1 | 0.15 | 0.1 |
|  | b | — | — | — | — | — |
|  | c | — | — | — | — | — |
| Refractive index |  | 1.57 | 1.57 | 1.57 | 1.56 | 1.60 |
| Curability | Gel time (sec) | 480 | 257 | 134 | 462 | 220 |
| Water content | Before placing in chamber (%) | 0.2169 | 0.1737 | 0.2201 | 0.2169 | 0.1646 |

TABLE 3-continued

| | | Comparative Example | | | | |
|---|---|---|---|---|---|---|
| | (parts by weight) | 1 | 2 | 3 | 4 | 5 |
| | After standing in camber (%) | 0.3196 | 0.2998 | 0.3645 | 0.3257 | 0.2866 |
| | Water absorbability (%) | 47.3 | 72.6 | 65.6 | 50.2 | 74.1 |

*)The amount of the photopolymerization initiator is a blend amount as a 50% by weight propylene carbonate solution.

TABLE 4

| | | Comparative Example | | | | |
|---|---|---|---|---|---|---|
| | (parts by weight) | 6 | 7 | 8 | 9 | 10 |
| Epoxy resin | a | — | 38 | — | 25 | 10 |
| | b | — | — | 50 | — | — |
| | c | 50 | 32 | — | 15 | 50 |
| | d | — | — | — | 45 | — |
| | e | 40 | 25 | 40 | 10 | 25 |
| Oxetane compound | a | — | — | — | — | — |
| | b | 10 | 5 | 10 | 5 | 15 |
| | c | — | — | — | — | — |
| | d | — | — | — | — | — |
| Photopolymerization Initiator*) | a | 0.15 | — | — | 0.2 | 0.15 |
| | b | — | 2 | — | — | — |
| | c | — | — | 0.1 | — | — |
| Refractive index | | 1.60 | 1.57 | 1.60 | 1.57 | 1.58 |
| Curability | Gel time (sec) | 478 | 96 | 493 | 555 | 256 |
| Water content | Before placing in chamber (%) | 0.1754 | 0.1867 | 0.1746 | 0.17 | 0.1611 |
| | After standing in camber (%) | 0.3008 | 0.3091 | 0.2989 | 0.2809 | 0.2582 |
| | Water absorbability (%) | 71.5 | 65.6 | 71.2 | 65.2 | 60.3 |

*)The amount of the photopolymerization initiator is a blend amount as a 50% by weight propylene carbonate solution.

From the results in the above Tables, it is known that all the photocurable resin compositions of Examples and Comparative Examples exhibit that a refractive index of the cured product is 1.55 or more and the samples of Examples have reduced water content (water absorbability) while showing short gel time and high curability as compared with the samples of Comparative Examples having the same number as the number of Examples. Therefore, in the case where the photocurable resin compositions of the above-mentioned Examples according to the invention are used as materials for optical components such as optical lenses, productivity becomes excellent owing to the high curability (rapid curing) and also reliability is high owing to the low water absorbability as mentioned in the above, so that defective quality in the optical components is hardly generated.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2010-158038 filed on Jul. 12, 2010, and the contents are incorporated herein by reference.

All references cited herein are incorporated by reference herein in their entirety.

Also, all the references cited herein are incorporated as a whole.

The photocurable resin composition of the invention forms a three-dimensional molded article (cured product) having high transparency even after cured, not detracting from the curability. Accordingly, the resin composition is useful for optical use applications as a molding material for optical components such as optical lenses (material for optical components) and a photocurable adhesive for fixation of optical components. Since the optical component using the photocurable resin composition of the invention has high reliability, it is usable as optical components such as optical lenses (optical products).

What is claimed is:

1. A photocurable resin composition comprising an epoxy resin, an oxetane compound and a photopolymerization initiator,
wherein the epoxy resin comprises the following ingredients (A) and (B) in combination, and the oxetane compound comprises the following ingredient (C):
(A) an epoxy resin having at least two epoxy groups in one molecule thereof and being liquid at 60° C. or higher;
(B) a solid epoxy resin having at least two epoxy groups in one molecule thereof and having a refractive index of 1.6 or more by itself; and (C) an oxetane compound represented by the following general formula (1):

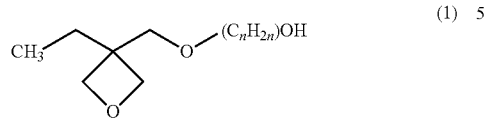

(1)

wherein n is an integer of 1 to 6.

2. The photocurable resin composition according to claim 1, wherein the ingredient (C) is contained in an amount of from 5 to 15% by weight relative to 100% by weight of a total resin amount in the resin composition.

3. The photocurable resin composition according to claim 1, wherein the ingredient (B) is a fluorene epoxy resin.

4. The photocurable resin composition according to claim 1, wherein the ingredient (A) is contained in an amount of from 40 to 85% by weight and the ingredient (B) is contained in an amount of from 10 to 45% by weight relative to 100% by weight of the total resin amount in the resin composition.

5. An optical component formed from a cured product of the photocurable resin composition according to claim 1 and having a refractive index of 1.55 or more.

\* \* \* \* \*